United States Patent

[11] 3,569,866

[72] Inventor Chase P. Hearn
Williamsburg, Va.
[21] Appl. No. 779,024
[22] Filed Nov. 26, 1968
[45] Patented Mar. 9, 1971
[73] Assignee The United States of America, as represented by the Administrator of the National Aeronautics and Space Administration

[54] WIDEBAND VCO WITH HIGH PHASE STABILITY
3 Claims, 1 Drawing Fig.

[52] U.S. Cl. .......... 331/117, 331/109, 331/177, 332/30
[51] Int. Cl. .......... H03b 5/12
[50] Field of Search .......... 331/36 (C), 177 (V), 117, 109, 183; 332/30 (V)

[56] References Cited
UNITED STATES PATENTS

| | | | |
|---|---|---|---|
| 3,068,427 | 12/1962 | Weinberg .......... | 332/30 |
| 3,276,032 | 9/1966 | Ordower .......... | 331/183 |
| 3,321,715 | 5/1967 | Bloch .......... | 331/183 |

*Primary Examiner*—John Kominski
*Attorneys*—Howard J. Osborn, William H. King and G. T. McCoy

ABSTRACT: This disclosure describes a wideband voltage controlled oscillator with high phase stability. A resonator consisting of a number of identical L-C resonators reactively coupled to the input and the output of a highly phase stable amplifier is described. The resonant frequency of each resonator is controlled by applying a modulating signal to voltage variable capacitors which form a portion of the resonators. In addition, the amplifier has electrically-variable negative feedback which improves its phase stability and simultaneously provides a means for maintaining the oscillations nearly sinusoidal.

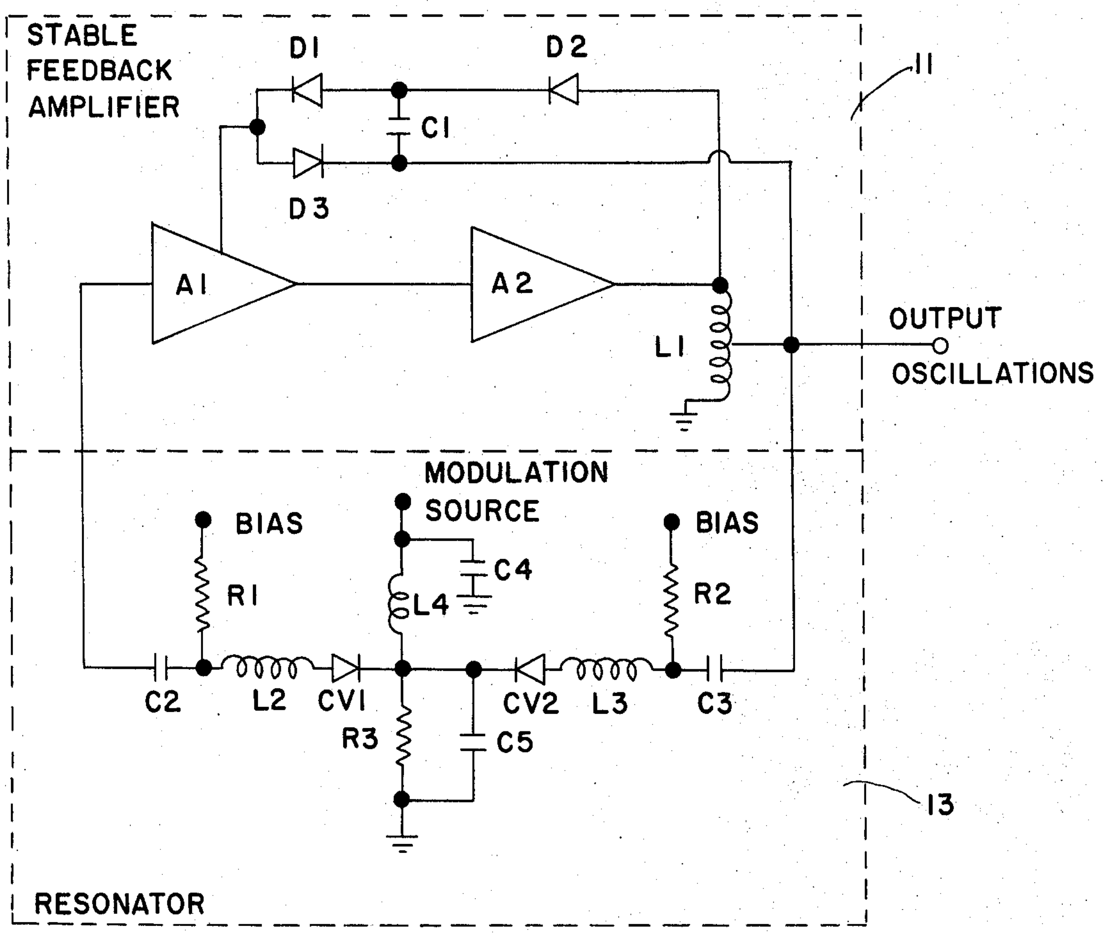
INVENTOR.
CHASE P. HEARN
BY
William H. King
ATTORNEYS

WIDEBAND VCO WITH HIGH PHASE STABILITY

BACKGROUND OF THE INVENTION

The need for and the use of an oscillator that generates highly stabilized oscillations that are electrically variable over a wide range is well known. The prior art has attempted to provide such an oscillator; however, the apparatus resulting from such attempts has not been entirely satisfactory.

The phase stability of any oscillator is dependent upon the ability of the oscillators resonant components to correct for random phase perturbations occurring within the oscillators feedback loop. How well a particular resonator can correct for phase perturbations external to the resonator can be determined by measuring the resonator's normalized rate-of-change of phase with respect to frequency. The "stability factor" obtainable with a simple L-C resonator is limited by the loaded Q of the resonator. That is, the stability factor is equal to twice the Q of the resonator circuit. And, it is well known that Q's above 300 are difficult, if not impossible, to obtain with lumped L-C components. Hence, conventional L-C tuned oscillators are limited in stability because of the limits placed on the lumped components that make up the resonator portion of the oscillator circuit. This result remains true even though the L-C components are electrically variable.

Oscillators having extremely high stability factors using piezoelectric crystals have been developed by the prior art; however, the frequency range over which a crystal controlled oscillator can be modulated is quite limited—typically less than .1 percent of the center frequency.

"Reactance Tube" modulators are another form of oscillator that has been developed by the prior art. This type of oscillator is capable of somewhat wider frequency deviation than a piezoelectric crystal controlled oscillator; however, it suffers from an added problem. Specifically, these oscillators include an active element in shunt with the resonator circuit which introduces a source of phase instability into the overall oscillator system.

A more sophisticated prior art apparatus for frequency stabilization uses a frequency modulated oscillator phase-locked to a highly stable fixed frequency oscillator source. The primary disadvantages of this system are: the center frequency of the oscillator is not variable, and, there is a lower limit on the modulating frequency which limits the deviation rate to something greater than the phase-locked loop bandwidth.

In summary, frequency modulated oscillators using single L-C resonators with electrically variable reactance elements or "Reactance Tube" oscillators are both fundamentally limited in their ability to generate highly phase stable oscillations. Highly phase stable crystal oscillators are incapable of wideband frequency deviation. Phase-locked loop stabilized oscillators have a lower rate limit beyond which they cannot be deviated. In addition, the center frequency of phase-locked loop stabilized oscillators cannot be varied electrically. Hence, prior art oscillators do not provide stable wideband oscillators.

Therefore, it is an object of this invention to provide a wideband voltage controlled oscillator having high phase stability.

It is also an object of this invention to provide a wideband voltage controlled oscillator having high phase stability that is electrically uncomplicated, and, therefore, inexpensive to manufacture.

It is still a further object of this invention to provide a new and improved voltage controlled oscillator having high phase stability over a wideband that uses conventional components.

SUMMARY OF THE INVENTION

In accordance with a principle of this invention, a wideband voltage controlled oscillator having high phase stability is provided. The invention consists of two basic subsystems: (1) a highly phase stable amplifier with electrically variable negative feedback; and (2) a resonator circuit consisting of a number of identical L-C resonators tuned with voltage variable capacitors; the resonant circuits are reactively coupled together and reactively coupled to the input and the output of the highly phase stable amplifier. The resonant frequency of each resonator circuit is varied by applying a modulating signal to the resonators.

In accordance with another principle of this invention, the electrically variable negative feedback portion of the highly phase stable amplifier includes means for developing a DC voltage proportional to the oscillator output voltage level. The DC voltage is applied to a voltage-variable negative feedback network consisting of semiconductor diodes which function as variable resistance elements.

In accordance with yet another principle of this invention, the modulating signal is applied to coupled pairs of resonant circuits by low pass filter sections whose cutoff frequency is slightly greater than the highest modulating frequency.

It will be appreciated from the foregoing summary of the invention that a wideband highly phase stable oscillator is provided. The oscillator is formed of conventional components and, hence, it is inexpensive to manufacture. In addition, the components making up the invention are connected in uncomplex fashion. It will also be appreciated that electrically variable negative feedback gain control circuit results in nearly linear operation and stabilizes the phase characteristic of the amplifier with respect to fluctuations in ambient temperature and supply voltages. The multisection resonator exhibits a stability factor greater than that of any one section; hence, it can correct for a loop phase perturbation with a smaller frequency perturbation.

BRIEF DESCRIPTION OF THE DRAWING

The foregoing objects and many of the attendant advantages of this invention will become more readily appreciated as the same becomes better understood by reference to the following detailed description when taken in conjunction with the accompanying drawing wherein a preferred embodiment of the invention is illustrated.

DESCRIPTION OF THE PREFERRED EMBODIMENT

The FIGURE illustrates a preferred embodiment of the invention and comprises a stable feedback amplifier section 11 and a resonator section 13. The stable feedback amplifier section 11 comprises first and second amplifiers designated A1 and A2; first, second and third diodes designated D1, D2 and D3; a first capacitor designated C1; and, a first inductor designated L1. The first amplifier has a control input and the first inductor L1 has a variable tap.

The output from A1 is connected to the input of A2 and the output of A2 is connected through L1 to ground. The output of A2 is also connected to the anode of D2. The cathode of D2 is connected to the anode of D1. The cathode of D1 is connected to the anode of D3 and to the control input of A1. The cathode of D3 is connected to the tap of L1. C1 is connected between the anode of D1 and the cathode of D3. Preferably, D1 and D2 and D3 are high-frequency point-contact diodes.

By the foregoing connection, D2 and C1 develops a DC voltage proportional to the oscillator output level. This voltage is applied to D1 and D3 which are in series to the control current input of A1 and in parallel to the output voltage of the oscillator. When the output level increases, the dynamic resistance of D1 and D3 reduces. The reduction in the dynamic resistance of D1 and D3 increases the amount of negative feedback, thereby establishing a new operating gain for the tandem amplifiers.

It will be appreciated by those skilled in the art that negative feedback is used around the amplifiers to providec certain desired results. First, negative feedback tends to make the transfer characteristic of the circuit independent of the properties of the active elements contained in the amplifiers. Second, the ratio of closed loop phase instability to open loop phase instability is reduced in direct proportion to the amount of negative feedback. Third, negative feedback furnishes an easy means of controlling amplifier gain so that oscillations are nearly sinusoidal. The amount of negative feedback is easily regulated by the diodes, because they are connected so that their resistance can be varied by the control current derived form the rectified oscillator output voltage. That is, the tap on L1 is easily adjusted to control the level of negative feedback.

The resonator section 13 of the embodiment of the invention illustrated in the FIGURE comprises: second, third, fourth and fifth capacitors designated C2, C3, C4 and C5; second, third and fourth inductors designated L2, L3 and L4; first, second and third resistors designated R1, R2 and R3; and, first and second voltage variable capacitors designated CV1 and CV2. L1's tap is connected through C3 in series with L3 to the anode of CV2 and to an output terminal. The cathode of CV2 is connected to the cathode of CV1 and the anode of CV1 is connected through L2 in series with C2 to the input of A1. The junction between C2 and L2 is connected through R1 to a bias source. Similarly, the junction between C3 and L3 is connected through R2 to a bias source. The junction between the cathode of CV1 and the cathode of CV2 is connected through R3 in parallel with C5 to ground. The junction between the cathode of CV1 and the cathode of CV2 is also connected through L4 in series with C4 to ground. The junction between L4 and C4 is connected to a terminal which is in turn connected to a source of modulation voltage (not shown). The bias voltages are DC and, the modulating voltage may contain frequency components extending from DC to the cutoff frequency of the low pass filter herein described.

L2 and CV1 form one resonator circuit and L3 and CV2 form a second resonator circuit. Each of these resonator circuits is tuned to the frequency of operation. The first and second resonator circuits are coupled together by C5. L4, C4, and C5 form a low pass filter section whose cutoff frequency is slightly greater than the highest modulating frequency. R3 is the filter load and its resistance is much greater than the capacitive reactance of C5 at the frequency of oscillation. Preferably, the resistance of R3 matches the characteristic impedance of the low pass filter. Ordinarily the prior art would use an isolation resistance to apply modulation directly to C5; however, this causes serious attenuation at higher modulation frequencies. Hence, the filter arrangement is mandatory for high modulating frequencies. In addition, more elaborate filters can be utilized in the invention if a higher degree of isolation between the modulation signal and the oscillation signal in the resonator is desired. In addition, more L-CV resonator circuits can be utilized if a further increase in phase stability is required. In some situations, a phase corrective network may be required to adjust the loop phase shift to a multiple 360°.

Capacitors C2 and C3 are coupling capacitors between the input and the output of the oscillator, respectively. And, R1 and R2 are coupling resistors between the DC bias source and the bias points in the resonator section.

It will be appreciated from the foregoing description of the invention that an electronically uncomplicated apparatus for creating highly phase stable oscillations over a wide bandwidth is provided. By controlling the modulation signal, the frequency of oscillation is controlled. In addition, by controlling the amount of feedback, the stability of the amplifiers forming a portion of the oscillator is achieved. In summary, the invention utilizes electrically variable negative feedback to maintain linear oscillation, a number of reactively coupled variable frequency resonators to obtain high stability, and a filter arrangement to modulate the variable frequency resonators.

It will be appreciated that the foregoing description describes a preferred embodiment of the invention and that various changes can be made within the scope of the invention. For example, as previously stated, other filter arrangements can be utilized to couple the modulation source to the resonator circuits. In addition, more than two resonator circuits an be used if greater stability is required. Hence, the invention can be practiced otherwise than as specifically described herein.

I claim:

1. A wideband voltage controlled oscillator with high phase stability comprising:
- a stable feedback amplifier having variable negative feedback for high phase stability;
- first and second voltage tuned resonators for controlling the frequency of oscillation coupled between the input and the output of said feedback amplifier;
- said first voltage tuned resonator including a first capacitor a first inductor and a first voltage variable capacitor connected in series with said first capacitor connected to the input of said feedback amplifier;
- said second voltage tuned resonator including a second capacitor, a second inductor and a second voltage variable capacitor connected in series with said second capacitor connected to the output of said feedback amplifier and with said second voltage variable capacitor connected to said first voltage variable capacitor;
- first bias means connected to the junction of said first capacitor and said first inductor;
- second bias means connected to the junction of said second capacitor and said second inductor; and
- means for connecting a modulation source to said first and second voltage tuned resonators, said means including a third inductor connected between said modulation source and the junction of said first and second voltage variable capacitors, a first resistor and a third capacitor connected in parallel between the junction of said first and second voltage variable capacitors and ground, and a fourth capacitor connected between said modulation source and ground.

2. A wideband voltage controlled oscillator with high phase stability as claimed in claim 1, wherein said stable feedback amplifier comprises:
- a controllable first amplifier having its input connected to said first capacitor;
- a second amplifier having its input connected to the output of said first amplifier;
- a fourth inductor having a tap, said inductor connected between the output of said second amplifier and ground, the tap of said inductor connected to said second capacitor;
- a first diode having its cathode connected to the tap of said fourth inductor and its anode connected to the control input of said controllable first amplifier;
- a second diode;
- a third diode; said second and third diodes connected in series so that the cathode of said second diode is connected to the control input of said controllable first amplifier and the anode of said third anode is connected to the output of said second amplifier; and
- a fifth capacitor connected between the junction of said second and third diodes and the cathode of said first diode.

3. A wideband voltage controlled oscillator with high phase stability comprising:
- controllable amplifier means;
- an inductor having a tap connected to the output of said amplifier means;
- first and second diodes connected in series between the output and the control input of said amplifier means;
- a third diode connected between the control input of said amplifier means and said tap;
- a capacitor connected between said tap and the junction of said first and second diodes; and
- a multisection, voltage-tuned resonator for controlling the frequency of oscillation at said tap connected between said tap and the input to said amplifier means.